United States Patent [19]

Izu

[11] 4,142,898
[45] Mar. 6, 1979

[54] IMAGING FILM OF SENSITIZING LAYER UPON UV-SENSITIVE DIAZO LAYER

[75] Inventor: Masatsugu Izu, Chicago, Ill.

[73] Assignee: Energy Conversion Devices, Inc., Troy, Mich.

[21] Appl. No.: 713,406

[22] Filed: Aug. 11, 1976

Related U.S. Application Data

[63] Continuation of Ser. No. 502,349, Sep. 3, 1974, abandoned.

[51] Int. Cl.$^2$ .................... G03C 1/52; G03C 5/00; G03C 1/64
[52] U.S. Cl. .................... 96/75; 96/36; 96/38.3
[58] Field of Search .............. 96/67, 68, 27 R, 45.2, 96/36, 75, 38.3

[56] References Cited

U.S. PATENT DOCUMENTS

| | | | |
|---|---|---|---|
| 3,342,604 | 9/1967 | Sprague | 96/90 |
| 3,486,898 | 12/1969 | Wainer | 96/90 |
| 3,549,367 | 12/1970 | Chang et al. | 96/35.1 |
| 3,905,815 | 9/1975 | Bonham | 96/68 |

Primary Examiner—Edward C. Kimlin
Attorney, Agent, or Firm—Wallenstein, Spangenberg, Hattis & Strampel

[57] ABSTRACT

An imaging film comprising, as an essential component thereof, an imaging structure formed of a thin layer of a metal, or metal-like, image forming material on which there is provided a thin layer of an energy sensitive material. The imaging structure, in turn, has a coating or layer of a sensitizing material thereon which material comprises a composition formed of a mixture of one, or more, amines, organic halogen compounds and a polymer or copolymer. The sensitizing material acts not only to increase the absolute sensitivity of the basic imaging structure but, also, to extend its spectral sensitivity from essentially the invisible, or ultraviolet light region to the visible light region enabling the imaging film to be used as a primary recording film for the production, for example, of original microfilm having, among other things, uniquely high contrast, resolution and acuity characteristics.

4 Claims, 5 Drawing Figures

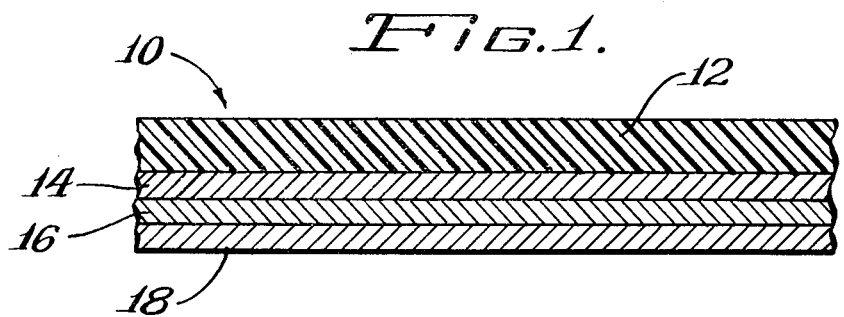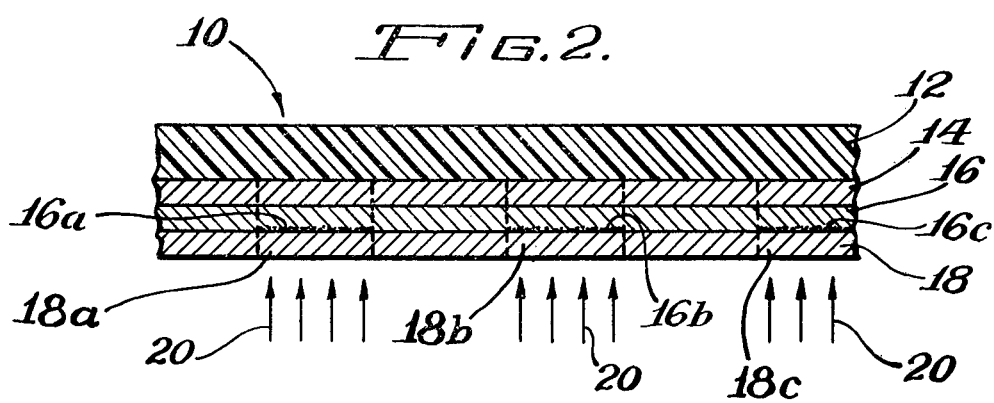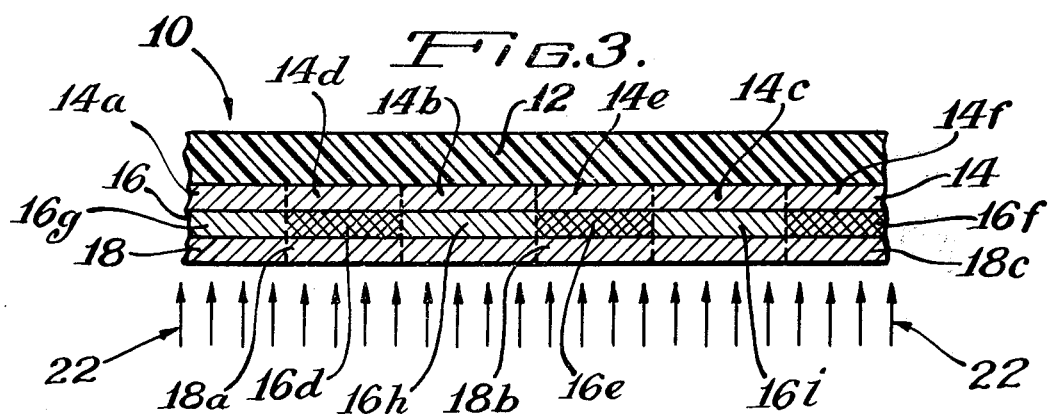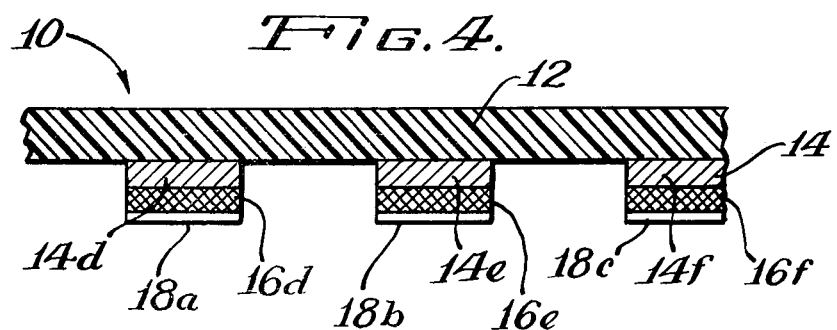

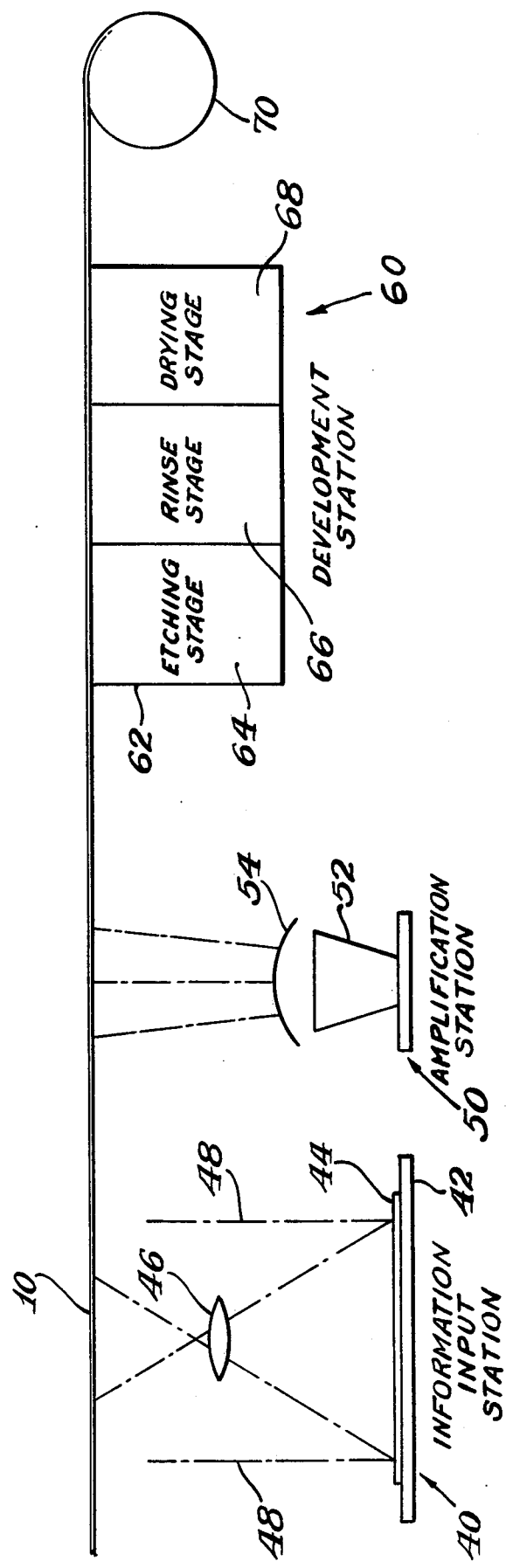

IMAGING FILM OF SENSITIZING LAYER UPON UV-SENSITIVE DIAZO LAYER

This is a continuation of application Ser. No. 502,349, filed Sept. 3, 1974, now abandoned.

This invention relates to an imaging film having special utility in the production of original microform, microfilm in particular.

Microform, such as microfilm, heretofore has been produced, in the main, by one of three processes, namely the diazo process, the silver halide process and the vesicular process. All of these microfilm making processes share one, or more, shortcomings chief among which are the relatively long exposure and/or development times required, the complexity and/or inconvenience in the materials and equipment needed to develop the film, and the poor quality of the enlarged microfilm image produced thereby. The vesicular process has the added disadvantage of very poor latent image stability which requires immediate development after exposure. A recently developed process for making microfilm, referred to as the dry silver process, is one which requires short exposure times and is developed rapidly by application of heat. However, this process, like the other referred to microfilm making processes, has resolution and contrast limitations which usually produce relatively poor quality readable copy when the microfilmed images are enlarged to full size.

The silver halide process uses silver halide films responsive primarily to visible light which reflects readily on light surfaces and is absorbed to a substantial degree by opaque inks. The diazo and vesicular films used in the diazo and vesicular processes are primarily responsive to ultraviolet radiation which does not reflect efficiently, if at all, from the materials used to make printed documents. Moreover, in comparison to silver halide films, which have a very high degree of sensitivity to visible light, diazo and vesicular films have a low degree of photosensitivity, even to ultraviolet radiation.

The most widely used process for producing original microfilm of a printed document uses a camera to take a picture of the visible light reflected from the document upon silver halide film through a microfilm reducing lens which produces about 24 to 1 or greater image reduction on the silver halide film. Since only a small percentage of the initially projected visible light is actually directed after reflection to the lens, only a highly photosensitive material like silver halide heretofore was thought to be practical for making original microfilm from printed documents. However, the images obtained on silver halide microfilm have low contrast, and poor edge definition and resolution due to the granular character of the silver halide emulsions and the film must be processed with special chemicals to impart archival properties to the finished product. Moreover, development of silver halide film requires the typical complex and time consuming developing process well-known in the art. This complexity of the developing process and the equipment used and the skilled personnel who operate the same are such that development is usually done by special film processing companies. Thus, the silver halide film development process requires of the order of at least tens of seconds to carry out development of the exposed film material and employs short-lived developing chemicals which are unpredictable, and which due to surface phenomena, are absorbed and adsorb on the surface of the film substrate to an extent such that drying of the developed sheet material is difficult. The nature of the process, therefore, requires a skilled operator to carry it out.

Microfilm copies are generally made by making contact copies of the original microfilm upon less expensive diazo or vesicular film. The low contrast and poor edge definition of the original silver halide film is transferred to the diazo or vesicular microfilm copies which are generally of comparably less or inferior quality as compared to the original microfilm. Upon enlargement of the microfilm image in a microfilm reader or the like, the poor contrast and edge acuity of the original microfilm produce marginally acceptable enlarged microfilm images. As previously indicated, while the dry silver process film would greatly reduce the complexity of the developing procedure, the contrast and resolution deficiencies referred to would also be present, and in those instances where microfilm copies are to be made therefrom, would involve a higher film cost than diazo and vesicular films.

To expand further on the deficiencies of the heretofore commonly used diazo and vesicular microfilm copying processes, the following additional facts should be kept in mind. While basically a low cost process, the diazo process has a number of important disadvantages, including the necessity, generally, for utilizing aqueous or gaseous ammonia as the developer for the exposed sheet material. Apart from its obnoxious properties, the use of aqueous or gaseous ammonia in the process requires special equipment to insure uniform distribution of ammonia vapor in the developing chamber, and to prevent the accumulation of any condensed ammonia vapors therein. Precautions, also, must be taken to prevent escape of ammonia vapors in the work area. Even then, ammonia vapors are invariably sensed in the work area. Over and above the foregoing considerations, the process requires expensive machinery with long path lengths to carry out development of the exposed sheet material, and, in addition, requires development times of the order of at least tens of seconds. Apart from these shortcomings, images produced by the diazo process have low contrast, a severe limitation especially in microfilm where, due to the requirement for considerable enlargement in readout, the highest possible contrast is needed. Furthermore, images produced by the diazo process tend to fade when exposed to light, and, therefore, are not permanent.

The vesicular developing process, also, is a complex process. Thus, for example, the vesicular film is first given an overall pre-exposure sensitization. This is followed by an imagewise exposure and heating which, because of the poor latent image stability of vesicular film materials, must be developed in a matter of seconds after exposure. Finally, a post-exposure fix is required. Development of the exposed sheet material requires temperatures in the range of 120° C. to 140° C. to bring about expansion of nitrogen gas released by a diazo component during exposure of the sheet material. Due to the relatively high development temperatures employed, vesicular films require the use of more costly, heat stable substrates. Heat also acts to erase the image and, therefore, suitable precautions must be taken to protect the developed film from heat during storage and use, a factor which detracts from the archival qualities of the film. Images obtained by the process have inferior edge acuity, limited resolution and relatively low contrast, and a contrast which is dependent upon the aperture system used.

While diazo and vesicular films have some cost and processing advantages over silver halide films, they have not been used to make original microfilms because of the fact that they cannot effectively respond to reflected visible or invisible light from printed documents. Additionally, they have such poor photosensitivity even to ultraviolet light that they have not been seriously considered for making microforms where relatively high recording rates become desirable.

In accordance with the present invention, an imaging film has been evolved which enables the production of images having contrast, resolution, and edge definition characteristics heretofore unattainable with conventional primary recording films. The imaging film of this invention, moreover, enables the production of images having these characteristics with materials which contain no precious metals such as silver, or the like, and which permit the development of the exposed film to be achieved in a fraction of the time required for other films without the need for skilled operators.

The imaging film of this invention constitutes an improvement of the imaging structure disclosed in co-pending applications Ser. No. 205,806, filed Dec. 8, 1971, now abandoned, and, the continuation-in-part thereof, Ser. No. 350,372, filed Apr. 12, 1973. The imaging film in its preferred form, therefore, comprises, as a basic, essential feature, an imaging structure which includes a thin, continuous layer of an image forming material supported on a flexible substrate, the layer of image forming material, in turn, being provided with a thin, continuous layer of an energy sensitive material. In accordance with the present invention, it has been discovered, surprisingly, that both the absolute and the spectral sensitivity of the imaging structure disclosed in the aforementioned co-pending applications can be increased by applying a transparent coating or layer of a sensitizing material, hereafter described in detail, on the energy sensitive material layer of the imaging structure. More specifically in this connection, it has been discovered that by applying the sensitizing material to the imaging structure disclosed in the aforementioned co-pending applications, an imaging film is attained having an absolute sensitivity of the order of $10^3 ergs/cm^2$ as compared to an absolute sensitivity of approximately $10^6 ergs/cm^2$, at 400nm, for the structure of said applications. At the same time an imaging film is provided wherein the spectral sensitivity of said imaging structure is extended from essentially the ultraviolet, or invisible light region to the visible light region. The changes in absolute and spectral sensitivity achieved with the sensitizing material are of a magnitude such that the imaging film of this invention has sufficient photographic speed and sensitivity to reflected light to permit its use in a camera. Over and above the foregoing considerations, a further unexpected and significant feature of the imaging film of this invention is that gain can be attained optically in the film under essentially totally dry conditions at comparatively low energy input levels.

While the basic imaging structure, as disclosed in the aforementioned co-pending applications, may comprise a layer of image forming material formed of a metal such as molybdenum, polonium, cobalt, zinc, aluminum, copper, nickel, iron, tin, vanadium, germanium, silver and silver emulsions, the generally optimum objectives of the invention disclosed in said co-pending applications, as in the case of the present invention, are most advantageously attained with an image forming material comprising tellurium, or a tellurium containing composition.

Generally, in those instances where a tellurium containing composition is used as the image forming material layer, the tellurium should constitute at least 50% of the composition, though, sometimes materials which contain less than 50% tellurium can be employed. Tellurium materials useful in the practice of this invention can be found among the tellurium containing memory materials described, for instance, in U.S. Pat. No. 3,721,591 issued on Sept. 22, 1970 to S. R. Ovshinsky.

These tellurium materials include the glassy compositions which contain, besides a major proportion of tellurium, one or more elements provided these other elements do not form a salt, or the like, with the tellurium. Typical tellurium compositions which can be used are, for example, a composition of 81 atomic parts tellurium, 15 atomic parts germanium, 2 atomic parts antimony and 2 atomic parts sulfur; a composition of 92.5 atomic parts tellurium, 2.5 atomic parts germanium, 2.5 atomic parts silicon and 2.5 atomic parts arsenic; a conmposition of 90 atomic parts tellurium, 5 atomic parts germanium, 3 atomic parts silicon and 2 atomic parts antimony; a composition of 85 atomic parts tellurium, 10 atomic parts germanium, 2.5 atomic parts indium and 2.5 parts gallium; a composition of 85 atomic parts tellurium, 10 atomic parts silicon, 4 atomic parts tellurium, 14 atomic parts germanium, 2 atomic parts bismuth, 2 atomic parts indium and 2 atomic parts sulfur; a composition of 70 atomic parts tellurim, 10 atomic parts arsenic, 10 atomic parts germanium and 10 atomic parts antimony; a composition of 60 atomic parts tellurium, 20 atomic parts germanium, 10 atomic parts selenium and 10 atomic parts sulfur; a composition of 60 atomic parts tellurium, 20 atomic parts germanium and 20 atomic parts selenium; a composition of 60 atomic parts tellurium, 20 atomic parts arsenic, 10 atomic parts germanium and 10 atomic parts gallium; a composition of 81 atomic parts tellurium, 15 atomic parts germanium, 2 atomic parts sulfur and 2 atomic parts indium; and numerous other tellurium containing compositions.

In the accompanying drawings

FIG. 1 is an enlarged sectional view of an embodiment of the imaging film of the present invention;

FIG. 2 is a view corresponding to the view or FIG. 1 showing the imaging film being subjected at preselected areas to rays from a visible light source;

FIG. 3 is a view corresponding to the views of FIGS. 1 and 2 showing the film being subjected to red light amplification;

FIG. 4 is an enlarged sectional view of the imaging film after development; and

FIG. 5 is a schematic representation of a system for producing original microfilm with the imaging film of the invention.

In accordance with the preferred practice of the present invention, the energy sensitive materials comprising the basic imaging structure advantageously are diazo compounds, especially the high molecular weight condensation products of these nitrogen compounds. Examples thereof are the water soluble high molecular weight condensation products obtained by condensation of diazotized diphenylamine type compounds with formaldehyde or other similar condensation agents. These compounds are water soluble, or water permeable, and give off, under the effect of actinic radiation, nitrogen to form a bakelite-like, substantially water insoluble, or water impermeable resinous product.

These compounds comprise high molecular weight diazonium salts in which the single molecules of the diazo compound are connected by methylene bridges or similar organic bridges. Typical examples of such compounds are p-diazodiphenylamine sulphate, p-dimethylaminobenzene diazonium chloride, p-diethylaminobenzene diazonium chloride, p-diethoxyaminobenzene diazonium chloride, 1-diazo-4-chloro-2, 5-diethoxybenzene, p-diazo-dimethylaniline zinc chloride, p-diazo-o-chloro-N-diethylaniline zinc chloride, 1 diazo-4-tolyl-mercapto-2, 5-diethoxybenzene zinc chloride, p-diazo-ethylhydroxyethylaniline zinc chloride, to name a few.

Also useful as energy sensitive materials are organic solvent soluble diazo compounds which can be prepared by reacting the high molecular weight diazo compounds mentioned above with organic compounds having phenolic hydroxy groups, phosphonic groups, phosphinic groups, carboxylic acid groups, sulfonic acid groups, or the like. Specific examples of such diazo compounds are diclosed in U.S. Pat. Nos. 3,510,307, 3,591,575 and 3,669,660.

Other useful energy sensitive materials may be obtained by linking, for instance, by help pf cyanuric chloride, or melamine, a diazonium substituent to a macrimolecular compound, such as cellulose, casein, polyvinyl alcohol, or the like. These high molecular weight energy sensitive compounds may, per se, make up the energy sensitive material layer or they may be present in admixture with another organic colloid.

A number of sensitive materials useful in the practice of the invention are available commercially. The high molecular weight, water soluble diazo resins made from paraformaldehyde and 4-diazo-diphenylamine bisulfate sold under the designations "Diazo Resin No. 4" (Fairmount Chemical Company), and "Diazo S" (American Holchst Co.) are especially preferred. In addition, the organic solvent developable photoresist comprising polyvinyl cinnamate sold under the designation KPR (Eastman Kodak) can be used, as can the product comprising low molecular weight polyisoprenes and an aromatic diazido compound sold under the designation KMER (Eastman Kodak).

The substrates which can be used in the fabrication of the basic imaging structure of the imaging film of the present invention advantageously are flexible films or sheets which desirably are transparent, or translucent, or light reflecting. Exemplary of such films are transparentized paper, filled papers, cellulose acetates, glassine paper, polyethylene, polypropylene, polyethylene glycol terephthalate (Mylar), polycarbonates, polyvinyl chloride, polyamides such as nylon, polystyrene, polymethyl chloro-acrylate, polyacrylonitrile, and the like. The thickness of the flexible films employed as the substrate is variable. Generally speaking, in the case of plastic films, the thickness can range from about 1 mil to 10 mils, or more.

As stated above in accordance with the present invention, it has been discovered that the absolute and the spectral, or light, sensitivity of the basic imaging structure comprising the layer of image forming material and the layer of energy sensitive material, as described above, can be significantly, and unexpectedly, increased by applying a thin, transparent or translucent, coating or layer of a sensitizing material on the energy sensitive material layer of the basic imaging structure. The sensitizing material essentially comprises a composition formed of a mixture of one, or more, amines, particularly, aromatic amines, a free-radical releasing organic halogen compound, and a polymeric resin in the form of a homopolymer, or copolymer. The unique effect of the sensitizing material on the absolute and the light sensitivity of the basic imaging structure enables full advantage to be taken, among other things, of the high contrast, resolution, and outstanding edge acutance capabilities of the basic imaging sturcture in the production, for example, of original microfilm with the imaging film of this invention.

The aromatic amines utilized in the preparation of the sensitizing material can be selected from a wide group. Included in this group are arylamines in which the amine nitrogen is attached to a carbocyclic nucleus; arylamines in which the compounds comprise both carbocyclic and heterocyclic constituents in their structure; and arylamines containing a vinyl group in their structure in which the vinyl group is attached directly to the amine nitrogen. Specific examples of some of the amines which can be used are diphenylamine, benzidine, 4,4'-methylenedianiline, 1-naphthylamine, tribenzylamine, p-toluidine, diphenylguanadine, indole, N-vinyl-carbazole, and the like. Exemplary of other aromatic amines useful for the purposes of this invention are the leuco bases or carbinol bases of di-and triaryl methane dyes, the styryl due bases, the vinylidene dye bases, xanthene dye bases, cyanine dye bases, merocyanine dye bases, and their mixtures. Amines of the foregoing type are disclosed, for example, in U.S. Pat. Nos. 3,100,703; 3,102,810; 3,106,466; 3,385,744; 3,342,603; 3,342,604 and 3,486,898.

Specific examples of aromatic amines which can be used in the formulation of the sensitizing material are 4,4',4"-tris (N,N-dimethylaminophenyl) methane, 4,4'-bis (dimethylaminophenyl) phenylmethane, 4,4'-bis (dimethylaminophenyl) naphthylmethane, 3,6-bis (dimethylamino)-9, 10-dihydro-9, 10-dimethyl anthracene, 4,4'-bis (dimethylaminophenyl) phenylcarbinol, 4,4'-bis (N,N-dimethylamino-phenyl) naphthylcarbinol, 2-(p-N,N-dimethylaminostyryl) quinoline, 2-(p-N,N-dimethylaminostyryl) benzothiazole, 4-(p-N,N-dimethylaminostyryl) quinoline, 1,1-bis (4-diethylaminophenyl) ethylene, bis (4-diethylamino-O-tolyl) phenylmethane, 3,6-bis (diethylamino)-9 (p-dimethylaminophenyl) xanthene, and the like.

The organic halogen compounds useful in the formulation of the sensitizing material layer of the imaging film of this invention include free-radical releasing organic halogen compounds such as those disclosed, for example, in U.S. Pat. Nos. 3,102,810, 3,342,603 and 3,486,898 and may be represented by the formula

wherein A is a monovalent radical selected from the group consisting of H, Cl, Br and I, unsubstituted alkyl, substituted alkyl, unsubstituted and substituted aryl, and aroyl, and X is a halogen atom selected from the group consisting of iodine, chlorine, and bromine. Specific examples of this group of compounds are carbon tetrabromide, iodoform, carbon tetraiodide, bromoform, pentabromoethane, hexachloroethane, hexabromoethane, α,α,α, -benzotribromide, 2-tribromomethyl-quinoxaline, tribromoguinaldine, and the like. Each of the foregoing compounds yields a halogen free radical when the bond joining a halogen atom to a polyhalogenated carbon atom is ruptured upon exposure to light.

The polymeric resins used in the formulation of the transparent sensitizing material layer may be either water, or organic solvent, soluble, or permeable, or both water and organic solvent soluble, or permeable. Exemplary of polymers useful in the preparation of the sensitizing material layer are poly (1,3-dioxolane), polyethylene oxide, polypropylene oxide and 2-hydroxyethylecellulose. Copolymers which can be used include the copolymer of 1,3-dioxolane with styrene oxide; the copolymer of 1,3-dioxolane with ethylene or propylene oxide; the copolymer of 1,3-dioxolane with dioxepane; the copolymer of 1,3-dioxolane with a substituted 1,3-dioxolane such as 4-phenyl-1,3-dioxolane, and mixtures thereof. Also useful are mixtures of the foregoing with polymers such as polyurethane, polyvinylformal, polyvinylacetate, polyvinylmethylether, polymethacrylate, polyethylmethacrylate, and the like.

The proportions of amine, organic halogen compound, and polymeric resin, comprising the sensitizing material are somewhat variable. The generally optimum objectives of the invention, however, are attained with amine-to-organic halogen compound-to-polymeric resin ratios of the order of about 1 to about 2 parts each of amine and organic halogen compound to about 0.5 to about 5 parts of polymeric resin, by weight, especially desirably about 1 part each of amine and organic halogen compound to about 2 parts of polymeric resin, by weight.

The sensitizing action of the sensitizing material advantageously can be enhanced and augmented by the incorporation of a small amount of a sensitizing dye. Exemplary of such a dye is 3-ethyl-5-[(3-ethyl-2 (3H)-benzoxazolidene)-ethylidene]-rhodanine. When used, the dye will comprise about 0.05 to 0.1 part, by weight of the sensitizing material.

One of the significant advantages of the imaging film of the present invention is that only very thin films or layers of image forming material, energy sensitive material and sensitizing material are required. This is due, in the main, to the fact that the useful image formed on the imaging film after exposure and development is not that of the film or layer of the energy sensitive material, or the sensitizing material, but, rather, the image forming material layer of the basic imaging structure. Therefore, since the image forming material need not be energy sensitive, the most important consideraton, apart from its solubility characteristics, in the selection of the image forming material is that it have sufficiently high opacity to provide the high contrast which characterizes the finished products of this invention. Generally speaking, depending upon the opacity of the image forming material, the desired high conrast can be attained with film or layer thicknesses of the image forming material in the range of about 50 to 5000 Angstroms, usually from about 1000 to about 2000 Angstroms. In those instances where tellurium, or a tellurium containing composition, comprises the image forming material film or layer, the generally optimum objectives of the invention are attained with film or layer thicknesses ranging from about 200 to about 4000 Angstroms, especially desirably from about 1000 to about 1500 Angstroms, with a thickness of about 1200 Angstroms being preferred. The economic importance of the extremely thin film or layer thicknesses of the image forming material employed in the imaging film of this invention becomes manifest when considered in relation to silver halide films, for example. Silver halide emulsion thicknesses used on such films generally range from 5 to 10 microns. The necessity for using silver halide emulsion layers of this thickness, coupled with the depletion of silver metal reserves and the concomitant rise in the price of the metal, point up the cost advantages attainable with the imaging films of this invention.

The image forming material film or layer of the basic imaging structure is further characterized in that it has an optical density in the aforementioned thicknesses of from about 0.5 to about 5, usually from about 2 to about 3. The image forming material may be deposited on a substrate by any of various standard practices. Thus, for example, in those instances where the image forming material comprises a metal, or a metal-like material such as tellurium or a tellurium containing composition, vapor deposition, vacuum deposition, or sputtering techniques can be employed.

Like the image forming material layer, only extremely thin layers of the energy sensitive material and the sensitizing material are needed. Basically, the layers of energy sensitive material and sensitizing material need be only thick enough to form a coherent or continuous surface on the image forming material layer and the energy sensitive material layer, respectively. No excess material is needed because neither material serves as a photoresist requiring a harsh etching agent, for instance, fuming acids, for development. Furthermore, as stated above, neither the energy sensitive material layer, nor the sensitizing material layer, comprises the final image produced on the film. With most energy sensitive materials useful in the preparation of the imaging film of this invention, the thickness of the energy sensitive material layer may range from about 0.1 micron to about 5 microns, especially desirably about 0.2 to about 0.6 micron, while the thickness of the sensitizing material layer may range from about 0.01 micron to about 1 or 2 microns, preferably about 0.1 to about 1 micron. The energy sensitive material and the sensitizing material advantageously are applied in the form of a solution by any of various known practices, including roller coating, spraying, spinning, dipping, and the like.

The following examples are illustrative of specific sensitizing material compositions having utility in the practice of the invention:

EXAMPLE I

| Ingredient | Amount |
| --- | --- |
| 1,4-dioxane (solvent) | 9 ml |
| 4,4',4"-tris(N,N-dimethyl-aminophenyl) methane | 0.026 g |
| 4,4'-bis(N,N-dimethyl-aminophenyl) naphthylmethane | 0.026 g |
| 4,4'-bis(N,N-dimethyl-aminophenyl) phenylmethane | 0.026 g |
| 2-(p-N,N-dimethylamino-styryl) benzothiazole | 0.026 g |
| 2-(p-N,N-dimethylamino-styryl)quinoline | 0.023 g |
| Iodoform | 0.156 g |
| Poly (1,3-dioxolane) | 0.4 g |
| Triphenylstibine | 0.006 g |

EXAMPLE II

| Ingredient | Amount |
| --- | --- |
| 1,4-dioxane (solvent) | 9 ml |
| Iodoform | 0.25 g |
| 4,4',4"-tris (N,N-dimethyl-aminophenyl) methane | 0.06 g |
| 4,4'-bis (N,N-dimethyl-aminophenyl) phenylmethane | 0.06 g |
| 4,4'-bis (N,N-dimethyl-aminophenyl) phenylcarbinol | 0.06 g |
| 2-(p-N,N-dimethylamino- | |

-continued

| Ingredient | Amount |
| --- | --- |
| styryl) quinoline | 0.075 g |
| Poly (1,3-dioxolane) | 0.5 g |
| Tetrahydrofurfurylalcohol | 0.15 g |
| Triphenylstibine | 0.01 g |

In order to provide a fuller understanding of the nature of the imaging film of the present invention, an embodiment of the film is illustrated in FIGS. 1–3 of the accompanying drawing.

As shown, the film 10 comprises a substrate 12 having deposited thereon a coating or layer 14 of an image forming material. On the layer 14 there is disposed a coating or layer 16 of an energy sensitive material as described hereinabove. The layer 16, in turn, is provided with a coating or layer 18 of a sensitizing material. When, as shown in FIG. 2, radiant energy rays 20 from a source of visible light, for example, are differentially reflected from the surface of a printed document, and pass through the areas 18a, 18b and 18c of the layer 18 of sensitizing material, photochemical reactions are induced between the sensitizing material and the energy material at the interface of these two layers, in the areas 16a, 16b and 16c, and also in the layer of sensitizing material in areas 18a, 18b and 18c. The extent of the reactions at this stage is small because the photochemical reactions are of the one photon one event type. Therefore, no image would be formed if the film 10 is developed at this stage.

Primary photochemical reactions in the areas 16a, 16b and 16c, and the areas 18a, 18b and 18c, are believed to be photochemical decomposition of the organic halogen compound, or of the complex of said compound with the aromatic amines. These reactions may be represented as follows, using iodoform as the organic halocompound, and triarylmethane type compounds (designated for convenience as leuco and styryl dye bases) as the aromatic amines:

  (1)

The active free radicals of (1) would attack the aromatic amines to generate dye molecules according to the following reactions:

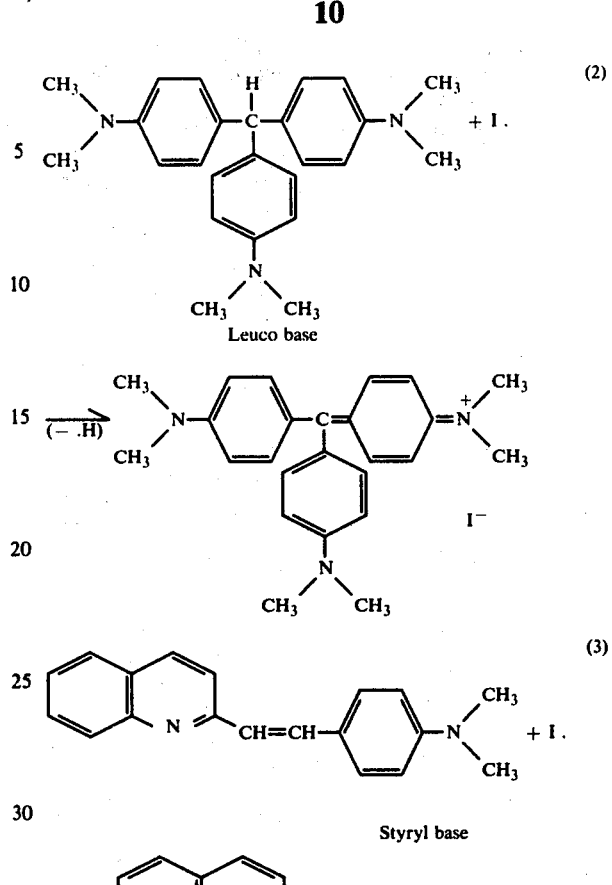

In the areas 16a, 16b and 16c of the layer 16 of the energy sensitive material (Diazo resin No. 4) is believed to be decomposed photochemically according to the following reaction:

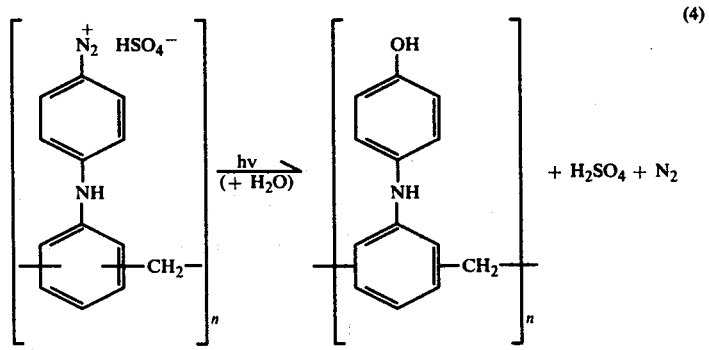

Reaction (4) is believed to be sensitized by the dye molecules formed by reactions (2) and (3).

Following initial exposure to the radiant energy rays 20, and after the photochemical reactions outlined above have taken place, the imaging film 10 is subjected to a red light amplification as shown in FIG. 3. The red light rays, designed by numeral 22, act to selectively excite the dye molecules resulting from the photochemical reactons of (2) and (3) above. The excited dye molecules are believed, in turn, to excite the iodoform or the iodoform - nitrogen containing organic compound complex to cause further occurrence of the reactions (1), (2) and (3). Thus, the dye image is selectively intensified in the imaged areas.

The excited dye molecules would also excite the energy sensitive material in the areas 16d, 16e and 16f of the layer 16 to cause further decomposition according to reaction (4) at the interface between the areas 18a, 18b and 18c of the layer 18 of sensitizing material and the areas 16d, 16e and 16f of the energy sensitive layer 16. As a result, as shown in FIG. 3, the energy sensitive material in the areas 16d, 16e and 16f undergoes a change between two states, one of which is a state in which the energy sensitive material is substantially soluble or permeable with respect to a given solvent, and the other being a state in which the energy sensitive material is substantially insoluble or impermeable with respect to the solvent. Since the energy sensitive material of the layer 16 is negative working the areas 16g, 16h and 16f of the material 16 which have not been exposed to the energy rays 20, therefore, remain in a soluble state. Thus, when the film 10 is contacted with one or more, solvents, as described hereafter, in which the energy sensitive material 16 is soluble, the energy sensitive material in the areas 16g, 16h and 16i is dissolved. The areas 16d, 16e and 16f of the energy sensitive material, having undergone a change to a substantially insoluble or impermeable state as a result of exposure to the rays 20 do not dissolve, and the areas 14d, 14e and 14f which underlie these substantially insoluble or impermeable areas are unaffected by the solvent. Accordingly, an image is formed, as shon in FIG. 4, by the opaque, image forming layer 14 in the areas 14d, 14e and 14f, each of which has an overlayer comprising insoluble areas 16d, 16e and 16f of energy sensitive material. The areas 16d, 16e and 16f, in turn, each have a thin overlayer of the sensitizing material comprising the areas 18a, 18b and 18c.

The unexposed areas 16g, 16h and 16i of the energy sensitive material layer 16, and the underlying areas 14b, 14b and 14c of the image forming material layer 14, together with the sensitizing material layer 18, can be removed in a matter of seconds in eithera multi-stage development system using separate and different solvents to remove first the layer 18 and the unexposed areas of the energy sensitive material, and then the underlying image forming material areas, or in a single stage, or common, solvent system to achieve the same end substantially simultaneously and essentially instantaneously. Further in this latter connection, in advantage of the imaging film of this invention is that development of the exposed film can be carried out in a single, aqueous solvent system or etchant. Apart from its capabilities for dissolving, or permeating, the soluble, or permeable, sensitizing material layer and the unexposed energy sensitive material, and then dissolving the underlying image forming material, the aqueous solvent system or etchant employed is characterized in that it is easily handled, unobnoxious, non-volatile, and affords excellent development latitude. Especially suitable for the purposes of this invention is a solvent system comprising a dilute aqueous solution of an alkali metal oxidizing agent exemplified by sodium hypochlorite, potassium hypochlorite, lithium hypochlorite, and the like. Such solutions not only have a high capacity for dissolving or permeating, unexposed portions of the energy sensitive material following amplification of the imaging film, but, also have a high capacity for dissolving the image forming material especially when the latter comprises tellurium or a tellurium containing material. In this latter connection, it is surprising and unexpected that an aqeous sodium hypochlorite solvent dissolves tellurium when deposited in the form of a thin film or layer as contemplated herein. An aqueous hypochlorite solution generally does not dissolve tellurium in the form of granules or small particles. On the other hand, the said solvent readily dissolves tellurium if it is deposited in the form of a thin film or layer. The tellurium is soluble in the aqueous sodium hypochlorite solution regardless of whether it is deposited by vapor, vacuum, or by sputtering techniques.

It is also noteworthy that the solvent capacity of the aforementioned single, or common, solvent system extends over a wide range of concentrations. Thus, for example, the full strength aqueous sodium hypochlorite solution obtained as a reagent from Baker Chemicals Company and having a concentration of 6.9% by weight, is an excellent solvent for the deposited layer of tellurium. The same reagent diluted to, for instance, 10% or even 1% of its strength is still a good solent for the deposited thin tellurium layers. Such solvents, as stated, have the added advantage of being unobnoxius, non-volatile and of affording excellent development latitude in that development, for example, of the film in the case where the energy sensitive material is a diazo compound of th type sold under the designation Diazo Resin No. 4, can take place therein at rates varying from 1 foot per minute to 100 feet per minute without adverse affect on the finished product. Further, in this same connection, a single quart of the solution is capable of processing as much as one thousand square feet of imaging film. The use of such a solution has the further important advantage of not requiring a skilled operator, or expensive and complicated processing equipment. The development latitude of aqueous solvents such as sodium hypochlorite and lithium hypochlorite can be enhanced by adding a suitable buffering agent to the solvent. Typical of such buffering agents are sodium and potassium bicarbonate. Other oxidizing agent types of solvents which can be used include aqueous hydrogen peroxide, and aqueous solutions of potassium chlorate. When utilizing multi-stage systems to develop the imaged film, a wide choice of solvents, both water-based and organic solvent-based, can be employed.

The imaging film produced in accordance with the practice of this invention has, as indicated, sufficient photographic speed to permit its use in a camera. In FIG. 5 of the drawing, a system which incorporates a camera for producing original microfilm with the imaging film is schematically shown. As illustrated, the system comprises an information input or exposure station 401, an amplification station 50, and a development station 60. The input station 40 includes a support member 42 for receiving a printed document 44, and a camera represented by the lens 46. The document 44 is placed face up on the member 42 whereby light 48 from a source (not shon) will be reflected from the light areas of the document through lens 46 of the camera. Associated with the camera is the film 10 of the present invention which is exposed to the reflected light passing through the lens 46. The time of exposure is dependent upon the intensity of the light source. By way of illustration, exposure of the film 10 to attain an optical density of the order of 2 can be achieved in from 3 to 15 seconds with a light intensity reflected from the original, as measured in the focal plane of the camera lens, of about 30 foot candles. The film 10, as shown, is in the form of a strip, which may be fed off of a roll, whereby a number of exposures of the same, or different, documents may be made in rapid, continuous succession. In a preferred practice of the invention, the film 10 would be in the form of a roll similar to the rolls of film commonly used in cameras.

The amplification station 50 comprises a source 52 of light. The light source desirably is a high intensity lamp such as a tungsten lamp, and the light from the source 52 advantageously is passed through an amberlith filter 54 while maintaining the film at a temperature of the order of 50° C. to 70° C., preferably 60° C. Amplification of the exposed film at the station 50 can be achieved in a short interval usually 1 to 60 seconds, depending on the intensity of the light source 52, and serves as described above, to promote, augment and enhance the dye catalyzed reaction between the sensitizing material and the energy sensitive material.

The development station 60 comprises a film processing unit 62. In the unit 62, the exposed film desirably is passed through three stages, an etching stage 64, a rinse stage 66, and a drying stage 68. At the etching stage 64, an etchant of the type described hereinabove advantageously is sprayed onto the exposed film. Etching of the film is followed by a rinse, usually with water, to remove any remaining unexposed areas of the film. The film is then squeegeed, and air-dried at the drying stage 68. The passage of the film through the development station requires only a few seconds. The end product, which is shown in FIG. 5 being wound on a take-up roller 70, is a ready-to-use film having uniquely high acuity, contrast and resolution, in addition to excellent archival properties.

The film 10, instead of being in roll form, can be mounted on a microfiche card, or the like, in which event successive exposures of frames on the microfilm mounted on the microfiche card can be indexed by automatic indexing means to effect exposure at the station 40. The outstanding capabilities of the imaging film of this invention as a duplicating film make it especially suitable for use as a computer output microfilm.

The following examples are illustrative of the use of the films of the present invention in the production of original microfilm:

EXAMPLE I

Into a 35 mm Conica camera with an f=4 lens opening there is loaded a film comprising a Mylar base having a vacuum deposited layer, 1200 Angstroms thick, of tellurium, a 0.2 micron thick layer of a photosensitive resin, namely, Diazo Resin No. 4, on the tellurium layer, and 0.5 micron thick layer of a sensitizing agent formed of the following composition:

| | |
|---|---|
| Iodoform | 0.25 g |
| 4,4',4''-tris(N,N-dimethyl-aminophenyl) methane | 0.06 g |
| 4,4'-bis(N,N-dimethylamino-phenyl) phenylmethane | 0.06 g |
| 2-(p-N,N-dimethylamino-styryl) quinoline | 0.075 g |
| Poly(1,3-dioxolane) | 0.5 g |
| Tetrahydrofurfurylalcohol | 0.15 g |
| Triphenylstibine | 0.01 g |

Two 1.5 kw lamps are used to illuminate an original document positioned approximately one foot below the lens of the camera. The light intensity reflected from the original measures approximately 30 foot-candles in the focal plane of the camera lens. The reduction ratio is 25X. The film is exposed for 8 seconds. The exposed film is then amplified for 1 minute with light from a tungsten lamp through an amberlith filter while the film temperature is maintained at 60° C. Following amplification, the film is developed with a solution containing 8 g of lithium hypochlorite and 2 g sodium bicarbonate in 100 ml of water. The developing time is 2 seconds. The developed filmed is rinsed with water and then acetone, and dried. A high quality reverse polarity microfilm of the original is obtained.

EXAMPLE II

The procedure outlined in Example I is followed except that the sensitizing agent layer of the film is formed from the following composition.

| | |
|---|---|
| Carbon tetrabromide | 0.156 g |
| 4,4',4''-tris(N,N-dimethyl-aminophenyl) methane | 0.026 g |
| 4,4'-bis(N,N-dimethylamino-phenyl) phenylmethane | 0.026 g |
| 4,4'-bis (N,N-dimethylamino-phenyl) naphthylmethane | 0.026 g |
| 2-(p-N,N-dimethylamino-styryl) quinoline | 0.023 g |
| 2-(p-N,N-dimethylamino-styryl) benzothiazole | 0.026 g |
| A copolymer of 1,3-dioxolane with ethylene oxide | 0.4 g |
| Triphenylstibine | 0.006 g |

A high quality reverse polarity microfilm of the original document is obtained.

EXAMPLE III

The procedure outlined in Example I is followed except that the film is developed in two stages. In the first stage, the film is dipped in an aqueous solution containing 2% sodium bicarbonate. In the second stage, the film is developed in an aqueous solution comprising 10% sodium chlorate and 5% citric acid. A high quality reverse polarity microfilm of the original document is obtained.

EXAMPLE IV

The procedure outlined in Example I is followed except that the sensitizing agent layer of the film is formed from the following composition.

| | |
|---|---|
| Tribromoquinaldine | 0.12 g |
| 2-(p-N,N-dimethylaminostyryl) quinoline | 0.05 g |
| Bis-(4-diethylamino-o-tolyl) phenylmethane | 0.05 g |
| Triphenylstibine | 0.01 g |
| Poly (1,3-dioxolane) | 0.7 g |

EXAMPLE V

The procedure outlined in Example I is followed except that the sensitizing agent layer of the film is formed from the following composition.

| | |
|---|---|
| Tribromoquinaldine | 0.12 g |
| 2-(p-N,N-dimethylaminostyryl) quinoline | 0.05 g |
| Triphenylstibine | 0.01 g |
| Poly (1,3-dioxolane) | 0.7 g |
| 3-ethyl-5 ] (3-ethyl-2-(3H)-benzoxazolidene)-ethylidene] rhodanine | 0.02 g |

What is claimed is:

1. An imaging film for use as an original recording film comprising an imaging structure normally relatively insensitive to electromagnetic radiation in the visible range, said imaging structure consisting essentially of a flexible plastic substrate, a thin film of a metal or metal-like image forming material, in which the useful image on the imaging film is formed, on a surface of the substrate, a thin film of an energy sensitive material in the form of a diazo compound on the film of image forming material, the energy sensitive material being characterized in that it is normally capable upon the application thereto of electromagnetic radiation in the invisible range of changing between two states, one of which is a state in which the energy sensitive material is substantially soluble or permeable with respect to a given solvent and the other being a state in which it is substantially insoluble or impermeable with respect to said solvent, and a coating of a sensitizing material in contact with the film of energy sensitive material, the sensitizing material consisting essentially of a mixture of (a) at least one aromatic amine capable in the presence of free-radicals of generating dye molecules, (b) an organic halogen compound capable of releasing free-radicals upon exposure to electromagnetic radiation, said organic halogen compound being represented by the formula A—C—X$_3$ wherein A is a monovalent radical selected from the group consisting of H, Cl, Br and I, unsubstituted alkyl, substituted alkyl, unsubstituted and substituted aryl, and aroyl, and X is a halogen atom selected from the group consisting of I, Cl and Br, and (c) a polymerized resin binder, said sensitizing material being characterized in that it is capable of interreacting at its interface with the energy sensitive material upon application of electromagnetic radiation in the visible range to the imaging film whereby the energy sensitive material undergoes a change in state normally occurring in the energy sensitive material upon application thereto of electromagnetic radiation in the invisible range, the change in state of the energy sensitive material resulting from the interreaction thereof with the sensitizing material enabling a desired image to be formed in the image forming material layer of the imaging film corresponding to the pattern of the areas of the imaging film subjected to electromagnetic radiation in the visible range.

2. An imaging film according to claim 1 wherein the image forming material is tellurium or a composition containing tellurium.

3. An imaging film according to claim 1 wherein the sensitizing material comprises a mixture of at least one leuco dye base and a styryl dye base.

4. An imaging film accordong to claim 1 wherein the sensitizing material comprises a polymerized resin binder selected from the group consisting of poly(1,3-dioxolane); polyethylene oxide; polypropylene oxide; hydroxyethylcellulose; copolymer of 1, 3-dioxolane with styrene oxide; copolymer of 1,3-dioxolane with ethylene oxide; copolymer of 1,3-dioxolane with propylene oxide; copolymer of 1,3-dioxolane with dioxepane; copolymer of 1,3-dioxolane with 4-phenyl-1,3-dioxolane; and mixtures of the foregoing with a polymer selected from the group consisting of polyurethane; polyvinylformal; polyvinylacetate; polyvinylmethyl ether; polymethylmethacrylate, and polyethylmethacrylate.

* * * * *